United States Patent

Huang et al.

[11] Patent Number: 5,976,951
[45] Date of Patent: Nov. 2, 1999

[54] METHOD FOR PREVENTING OXIDE RECESS FORMATION IN A SHALLOW TRENCH ISOLATION

[75] Inventors: Kuo-Tai Huang, Hsinchu; Chih-Hsiang Hsiao, Taipei; Chao-Yen Chen, Hsinchu, all of Taiwan

[73] Assignee: United Microelectronics Corp., Hsinchu, Taiwan

[21] Appl. No.: 09/106,746

[22] Filed: Jun. 30, 1998

[51] Int. Cl.$^6$ .................................................... H01L 21/76
[52] U.S. Cl. .................. 438/435; 438/424; 438/437; 438/427; 148/DIG. 50
[58] Field of Search .................... 438/424, 427, 438/433, 435, 437, 296

[56] References Cited

U.S. PATENT DOCUMENTS

| | | | |
|---|---|---|---|
| 4,952,524 | 8/1990 | Lee et al. | 438/437 |
| 5,387,540 | 2/1995 | Poon et al. | 148/DIG. 50 |
| 5,492,858 | 2/1996 | Bose et al. | 148/DIG. 50 |
| 5,763,315 | 6/1998 | Benedict et al. | 438/424 |

Primary Examiner—Trung Dang

[57] ABSTRACT

A method for forming an isolating trench in a substrate is disclosed herein. The forgoing method includes the following steps. First, form a first dielectric layer and a second dielectric layer on the substrate subsequently, and then develop a photoresist pattern on the second dielectric layer. Then, etch the substrate, the first dielectric layer and the second dielectric layer to form a trench in the substrate. Next, form a first silicon dioxide layer in the trench followed by removing the photoresist pattern. The next step is to form a third dielectric layer on the second dielectric layer and the first silicon dioxide layer. Subsequently, fill the trench with silicon dioxide to from an oxide trench; then remove the second dielectric layer, a first portion of the third dielectric layer and a portion of the oxide trench with a chemical mechanical polishing (CMP) and a first solution. The third dielectric layer mentioned above includes the first portion of the third dielectric layer and a second portion of the third dielectric layer. Finally, etch the first dielectric layer and the oxide trench to expose the substrate. The second portion of the third dielectric layer is used to prevent an oxide loss in the oxide trench; then the isolating trench being formed thereof.

19 Claims, 8 Drawing Sheets

METHOD FOR PREVENTING OXIDE RECESS FORMATION IN A SHALLOW TRENCH ISOLATION

BACKGROUND OF THE INVENTION

1. Field of the Invention

This invention relates to prevent oxide recess formation in a shallow trench isolation process, and particularly relates to a quarter micron or beyond process preventing oxide recess formation in a shallow trench isolation process.

2. Description of the Prior Art

In fabricating a transistor, as the scale of the transistor scaling down, the isolation technology progresses from local oxidation (LOCOS) to shallow trench isolation (STI). Especially when the line width shrinks from 0.35 $\mu$m to 0.25 $\mu$m or below, the shallow trench isolation is widely used in isolation technology. In fabricating a transistor, the traditional shallow trench isolation technology is described below. First, referring to FIG. 1, provide a substrate 100, then subsequently form a pad oxide layer 101 and a silicon nitride layer 102 on the substrate 100. Secondary, refer to FIG. 2, develop a photoresist pattern 103 on the silicon nitride layer 102 followed by etching the wafer. Thus the trench 104 is formed in the substrate 100, and the active area of the transistor is also defined. Then form a thermal oxide liner 105 in the trench 104, and the thermal oxide liner 105 is composed of silicon dioxide.

Next, remove the photoresist pattern 103 followed by depositing a silicon dioxide layer on the topography of the wafer by CVD (Chemical Vapor Deposition) and then planarize the CVD silicon dioxide layer by CMP (Chemical Mechanical Polish) method. Then, referring to FIG. 3, the trench isolation 106 is formed in the trench. Subsequently, remove the silicon nitride layer 102, and remove the pad oxide layer 101 by a first diluted HF (Hydrofluoric Acid). The first diluted HF is a mixture of hydrofluoric acid and ammonium fluoride at a ratio 1:10. The first diluted HF uses 15 seconds to remove the pad oxide layer 101. Meanwhile, referring to FIG. 4, the corner of the trench isolation 106 is attacked and the profile of the trench isolation 106 shrinks at the corner 107. Besides, the substrate 100 is exposed thereby. Refer to FIG. 5, the next step is to form a sacrifice oxide layer 108 on the substrate 100, and then use the ion implantation to form the channel in the active area of the transistor.

The next step is to remove the sacrifice oxide layer 108 by etching the wafer using a second diluted HF, referring to FIG. 6, thus the sacrifice oxide layer 108 is removed and the corner 105 of the trench isolation 106 is further attacked. The second diluted HF is a mixture of hydrofluoric acid and ammonium fluoride at a ratio 1:100. The second diluted HF uses 300 seconds to remove the sacrifice oxide layer 108. Thus the trench isolation 106 is fabricated in the substrate 100. To fabricate a transistor, the following step is to grow a gate oxide layer 110 on the substrate 100 and the trench isolation 106. Subsequently, deposit a gate poly layer 112 on the gate oxide layer 110. It is obvious that because the corner 105 (FIG. 5) of the trench isolation 106 shrank, referring to FIG. 7, the recess 120 is produced at the corner of the trench isolation 106.

In addition, if the shallow trench mentioned above is used in isolating the transistor, some traditional processes are applied to fabricate a transistor. After a series of process fabricating the transistor, the top view of the structure of the transistor mentioned above is shown in FIG. 8. The trench isolation 106 between the dashed rectangle and the solid rectangle adjoin to the drain and the source electrode, which also slightly overlapped with the gate poly. A cross sectional view of the transistor is cut by the broken line aa', and the right portion of the cross sectional view of the transistor near the terminal a' of broken line aa' is shown in FIG. 9.

As shown in FIG. 9, when the recess becomes serious, the kink effect becomes more serious. The kink effect, i.e. the local decrease in the threshold voltage at the channel edge, is always inherent to an abrupt isolation/active transition of STI process, which tighten the process window for manufacturing STI. So, in order to minimize the kink effect, it is important to reduce the recess 120.

SUMMARY OF THE INVENTION

Because the isolating trench according to the traditional technology can cause the kink effect, the present invention provides a method to form an isolating trench free from the kink effect. To minimize the kink effect, it is important to reduce the recess in fabricating the shallow trench isolation. Thus, a method for forming an isolating trench in a substrate is disclosed herein.

The method mentioned above includes the following steps. First, form a pad oxide layer and a silicon nitride layer on the substrate subsequently, and then develop a photoresist pattern on the silicon nitride layer. Then, etch the substrate, the pad oxide layer and the silicon nitride layer to form a trench in the substrate. Next, form a first silicon dioxide layer in the trench followed by removing the photoresist pattern. The next step is to form a silicon oxynitride layer on the silicon nitride layer and the first silicon dioxide layer. Subsequently, fill the trench with silicon dioxide to from an oxide trench; then remove the silicon nitride layer, a first portion of the silicon oxynitride layer and a portion of the oxide trench with a chemical mechanical polishing (CMP) and a first solution.

The silicon oxynitride layer mentioned above includes the first portion of the silicon oxynitride layer and a second portion of the silicon oxynitride layer. Finally, etch the pad oxide layer and the oxide trench to expose the substrate. The second portion of the silicon oxynitride layer is used to prevent an oxide loss in the oxide trench; then the isolating trench being formed thereof.

BRIEF DESCRIPTION OF THE DRAWINGS

The above features of the present invention will be more clearly understood from consideration of the following descriptions in connection with accompanying drawings in which:

FIG. 1 illustrates the cross sectional view of the semiconductor wafer that a pad oxide layer and a silicon nitride layer subsequently formed on the substrate;

FIG. 2 illustrates the cross sectional view of the semiconductor wafer that a shallow trench is formed in the substrate, and then a silicon dioxide layer is formed on the surface of the shallow trench mentioned above;

FIG. 3 illustrates the cross sectional view of the semiconductor wafer that a CVD (Chemical Vapor deposition) oxide is deposited in the shallow trench and polished by a CMP (Chemical Mechanical Polishing) process;

FIG. 4 illustrates the cross sectional view of the semiconductor wafer that the corner of the CVD oxide is attacked when etching the pad oxide layer and the silicon nitride layer, thus the shallow trench isolation according to the tradition technology is formed;

FIG. 5 illustrates the cross sectional view of the semiconductor wafer that an ion implant is used to form the channel of the transistor using the traditional shallow trench isolation;

FIG. 6 illustrates the cross sectional view of the semiconductor wafer that the sacrifice oxide layer formed before ion implant is removed and the corner of the CVD oxide is further attacked;

FIG. 7 illustrates the cross sectional view of the semiconductor wafer that a gate oxide layer and the gate poly oxide are subsequently formed on the substrate and the shallow trench;

FIG. 10 illustrates the cross sectional view of the semiconductor wafer that a pad oxide layer and a silicon nitride layer subsequently formed on the substrate;

FIG. 11 illustrates the cross sectional view of the semiconductor wafer that a shallow trench is formed in the substrate according to the present invention, and then a silicon dioxide layer is formed on the surface of the shallow trench mentioned above;

FIG. 12 illustrates the cross sectional view of the semiconductor wafer that a silicon oxynitride layer is formed on the surface of the silicon nitride layer and the shallow trench;

FIG. 13 illustrates the cross sectional view of the semiconductor wafer that a CVD (Chemical Vapor deposition) oxide is deposited in the shallow trench;

FIG. 14 illustrates the cross sectional view of the semiconductor wafer polished by a CMP (Chemical Mechanical Polishing) process, in addition, the silicon nitride layer is removed;

FIG. 15 illustrates the cross sectional view of the semiconductor wafer that the corner of the silicon oxynitride layer is higher than the CVD oxide after etching the pad oxide layer;

FIG. 16 illustrates the cross sectional view of the semiconductor wafer that a sacrifice oxide layer is formed on the topography of the semiconductor wafer and an ion implant is used to form the channel of the transistor using the shallow trench isolation according to the present invention;

FIG. 17 illustrates the cross sectional view of the semiconductor wafer that the sacrifice oxide layer formed before the ion implant is removed and the corner of the silicon oxynitride layer at the corner of the shallow trench is higher than the CVD oxide;

FIG. 18 illustrates the partial cross sectional view of the shallow trench isolation according to the present invention, in this figure, the recess in the shallow trench is eliminated.

DESCRIPTION OF THE PREFERRED EMBODIMENT

Figure 10:
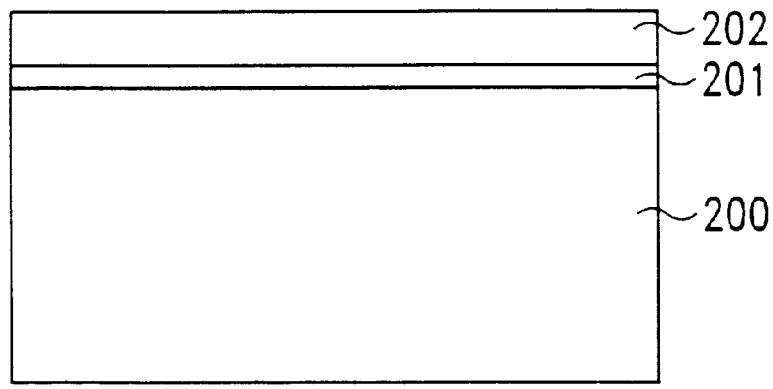
FIG. 10–17 illustrate a series of process for fabricating the shallow trench isolation in the present invention used in a transistor.
Figure 11:
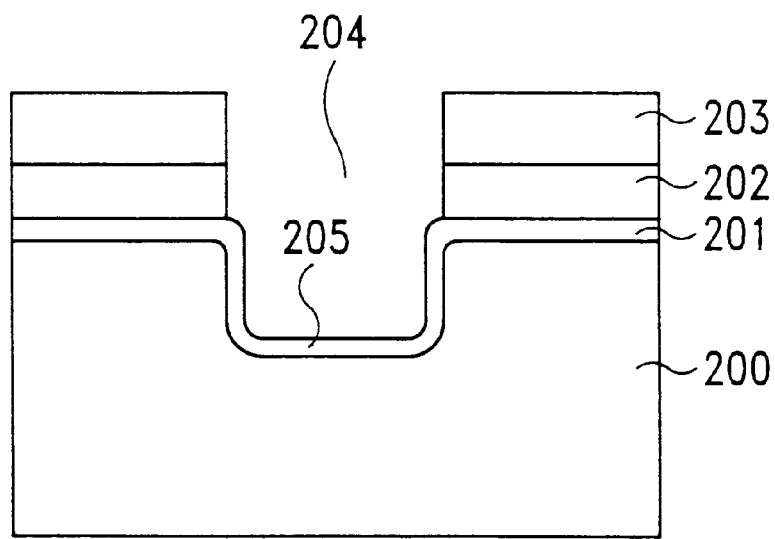

The present invention provides a method for eliminating the recess in fabricating the shallow trench isolation, especially for the method used in the quarter micron or beyond process. Because the traditional method for forming the shallow trench isolation will cause the kink effect due to the recess in the shallow trench isolation, so the present invention provides a process preventing the recess in the shallow trench isolation. For example, in fabricating a transistor, referring to FIG. 10, provide a substrate 200. Then subsequently form a pad oxide layer 201 and a silicon nitride layer 202 on the substrate 200. The thickness of the pad oxide layer 201 is about 100–200 angstroms, and the thickness of the silicon nitride layer 202 is about 1000–2000 angstroms. Next, refer to FIG. 11, develop a photoresist pattern 203 on the silicon nitride layer 202 followed by etching the silicon nitride layer 202, the pad oxide layer 201, and the substrate 200. Thus the trench 204 is formed in the substrate 200, and the active area of the transistor (not shown) is defined. Then form a thermal oxide liner 205 on the surface of the trench 204. As shown in FIG. 11, the thermal oxide liner 205 is formed by thermal process on the surface of the trench 204 in the wafer.

Figure 12:
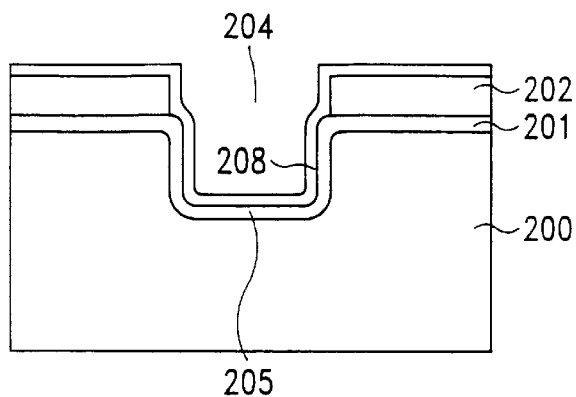
Figure 13:
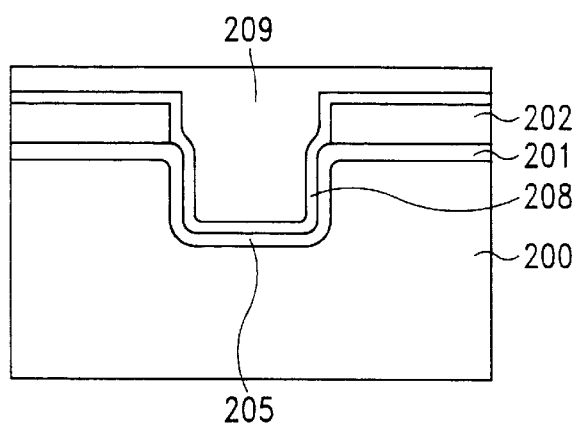

Next, use a plasma enhanced chemical vapor deposition (PECVD) to form an oxynitride layer on the topography of he wafer, referring to FIG. 12, thus the oxynitride liner 208 is formed on the thermal oxide liner 205 in the trench 204. The thickness of the oxynitride liner 208 is about 50–600 angstroms, and the power used to implement the PECVD is about 350 Watts when the frequency is high (about 13.56 MHz), whereas, the power is about 0–200 Watts when the frequency is low (about 200–400 KHz). The oxynitride liner 208 is composed of $SiO_xN_y$, and the $N_2O$ flow used to form the $SiO_xN_y$ is at most about 2000 cc (cubic centimeter) per minute. Thus, the oxynitride liner 208 in the preferred embodiment of the present invention is composed of $SiO_xN_y$, in which range of x and y are respectively shown as $0.8 \geq x \geq 1.2$ and $0.15 \geq y \geq 0.4$. Referring to FIG. 13, the next step is to form a silicon dioxide layer on the topography of the wafer by a chemical vapor deposition (CVD) method to form a trench isolation 209.

Figure 14:
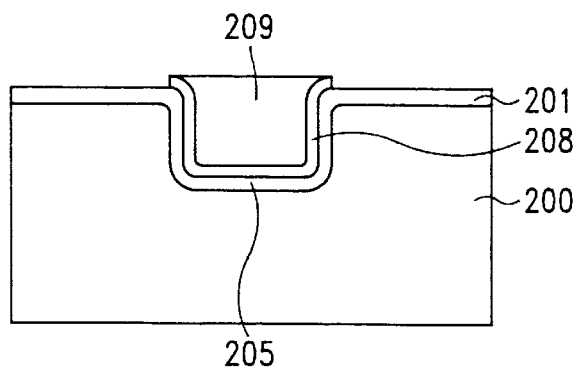
Figure 15:
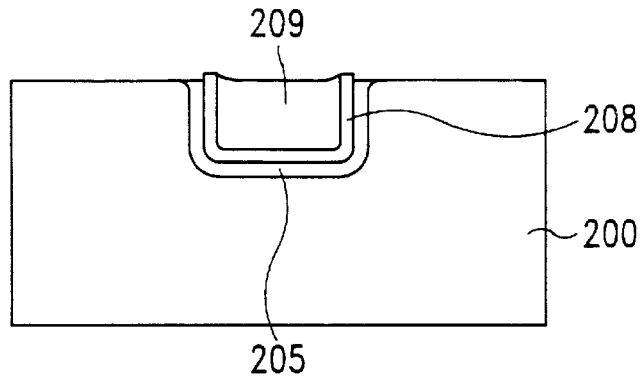
Figure 16:
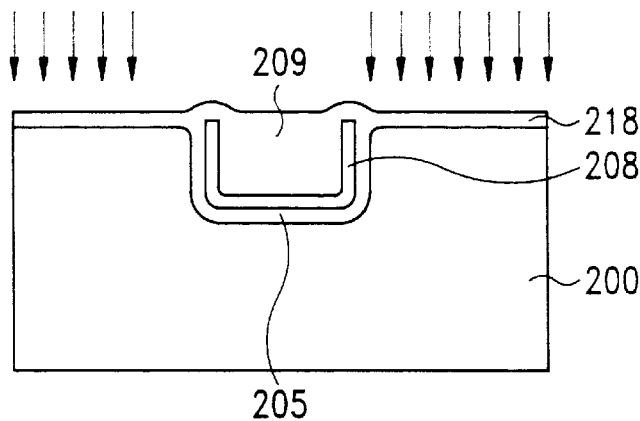

Subsequently, planarize the topography of the wafer and simultaneously remove the silicon nitride layer 202 by a chemical mechanical polish (CMP) method. Then use the $H_3PO_4$ to remove the residual silicon nitride layer 202. The cross sectional view of the wafer is shown in FIG. 14. Because different types of materials (silicon nitride layer 202 and oxynitride liner 208) are polished simultaneously in a CMP method, the top portion of the oxynitride liner 208 is higher than the pad oxide layer 201. Because the forgoing residual silicon nitride layer 202 is removed by a $H_3PO_4$ solution, the oxynitride loss in the oxynitride liner 208 at the trench corner is thus negligible. Then, refer to FIG. 15, remove the pad oxide layer 201 by a first diluted HF (Hydrofluoric Acid). The first diluted HF is a mixture of hydrofluoric acid and ammonium fluoride at a ratio 1:10. The first diluted HF uses 60 seconds to remove the pad oxide layer 201. As shown in FIG. 15, because the top portion of the oxynitride liner 208 protect the lateral etching from the trench isolation 209, the amount of oxide loss in the corner of the trench isolation 209 is greatly reduced. So the top portion of the oxynitride liner 208 and the corner of the trench isolation 209 are both higher than the thermal oxide liner 205. Thus, the substrate 200 is exposed, refer to FIG. 16, the next step is to form a sacrifice oxide layer 218 on the substrate 200 and the trench isolation 209, then perform an ion implantation to form the channel in the active area of the transistor.

Figure 17:
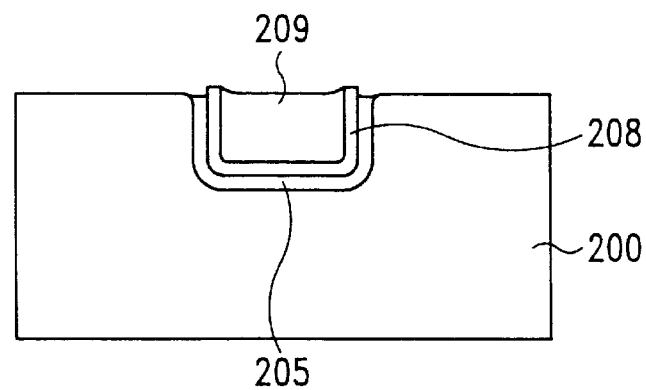
Figure 18:
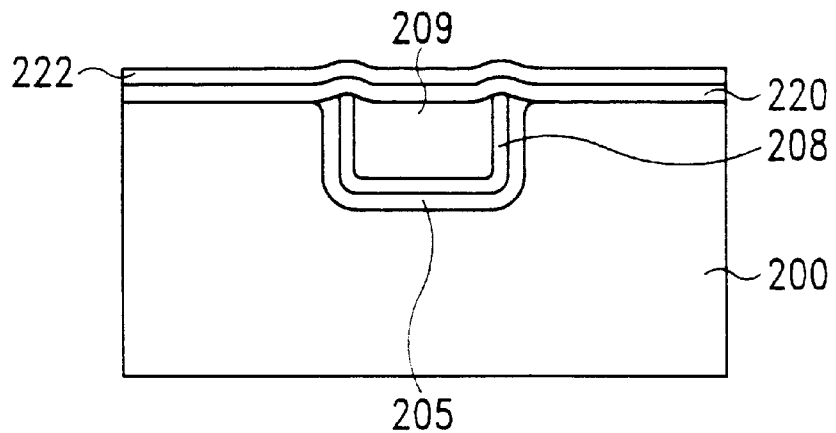
FIG. 18 illustrates the cross sectional view of the semiconductor wafer that a gate oxide layer and the gate poly silicon are subsequently formed on the substrate and the shallow trench.

The next step is to remove the sacrifice oxide layer 218 by a second diluted HF, referring to FIG. 17, the sacrifice oxide layer 218 is removed. Though the corner of the trench isolation 209 is attacked, the corner of the trench isolation 209 is protected from being further etched by the oxynitride liner 208, so there is not any recess at the corner of the trench isolation 209. Even there is a recess at the corner of the trench isolation 209, because the oxynitride liner 208 separates the trench isolation 209 and the thermal oxide liner 205, the recess mentioned above is far away from the side wall of the shallow trench isolation. So the shallow trench isolation mentioned above is kink effect free. The second diluted HF is a mixture of hydrofluoric acid and ammonium fluoride at a ratio 1:100. The second diluted HF removes the sacrifice oxide layer 218. Thus the trench isolation 209 is fabricated in the substrate 200. If the shallow trench mentioned above is used in isolating the transistor, some traditional processes are used to form the transistor. Refer to FIG. 18, the following step is to deposit a gate oxide layer 220 on the substrate 200 and the trench isolation 209. Subsequently, deposit a gate poly-silicon layer 222 on the gate oxide layer 220.

Figure 1:
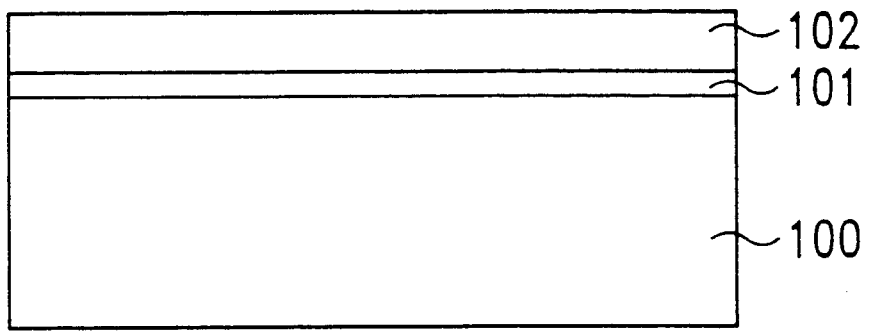
FIG. 1–FIG. 7 illustrate a series of process for fabricating the shallow trench isolation according to the prior art used in a transistor.
Figure 2:
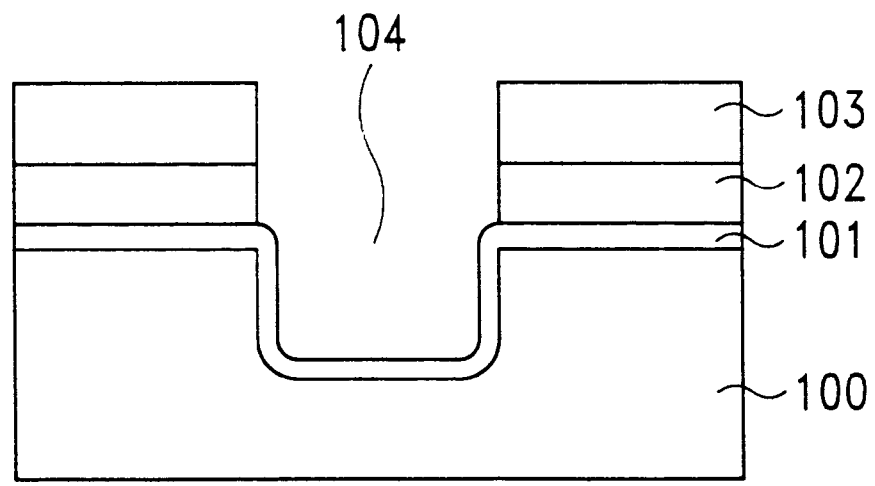
Figure 3:
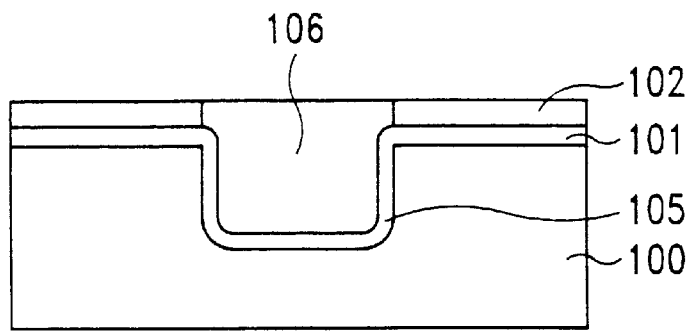
Figure 4:
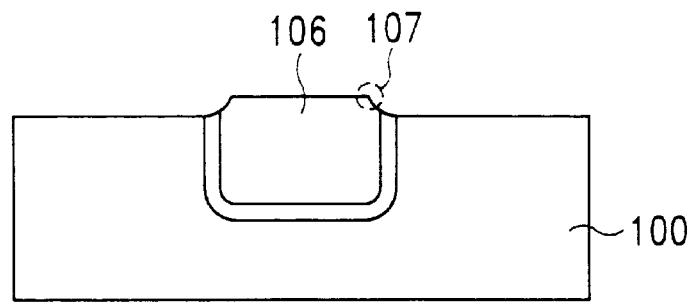
Figure 5:
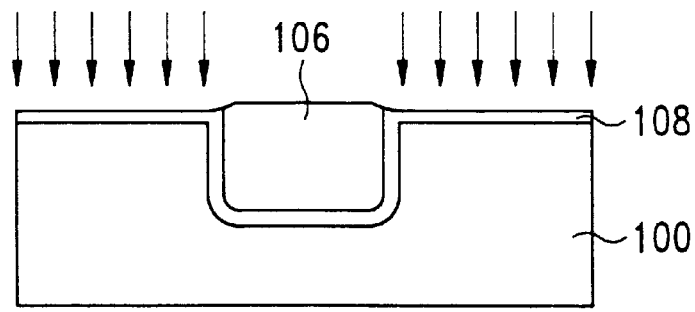
Figure 6:
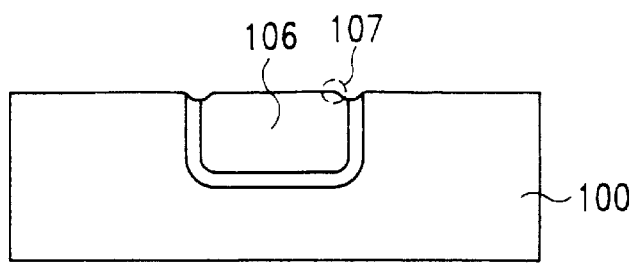
Figure 7:
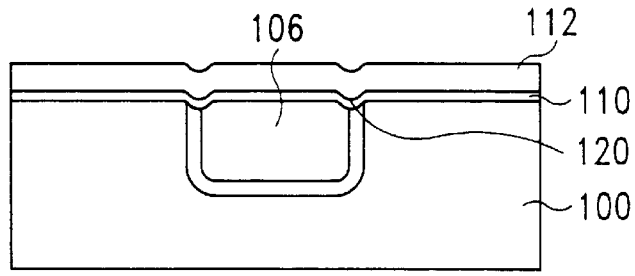
Figure 8:
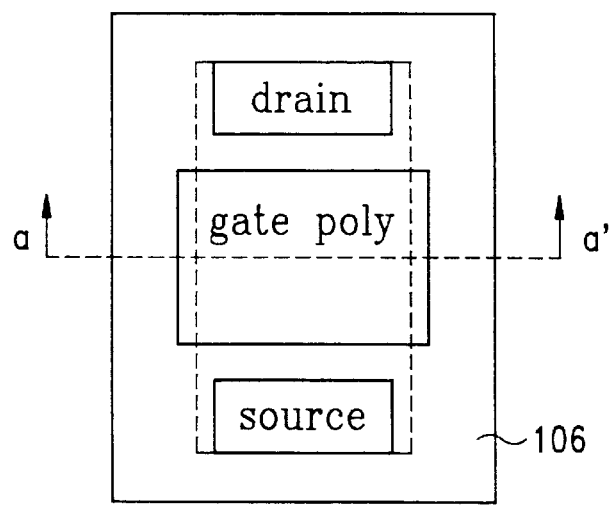
FIG. 8 illustrates the top view of the transistor.
Figure 9:
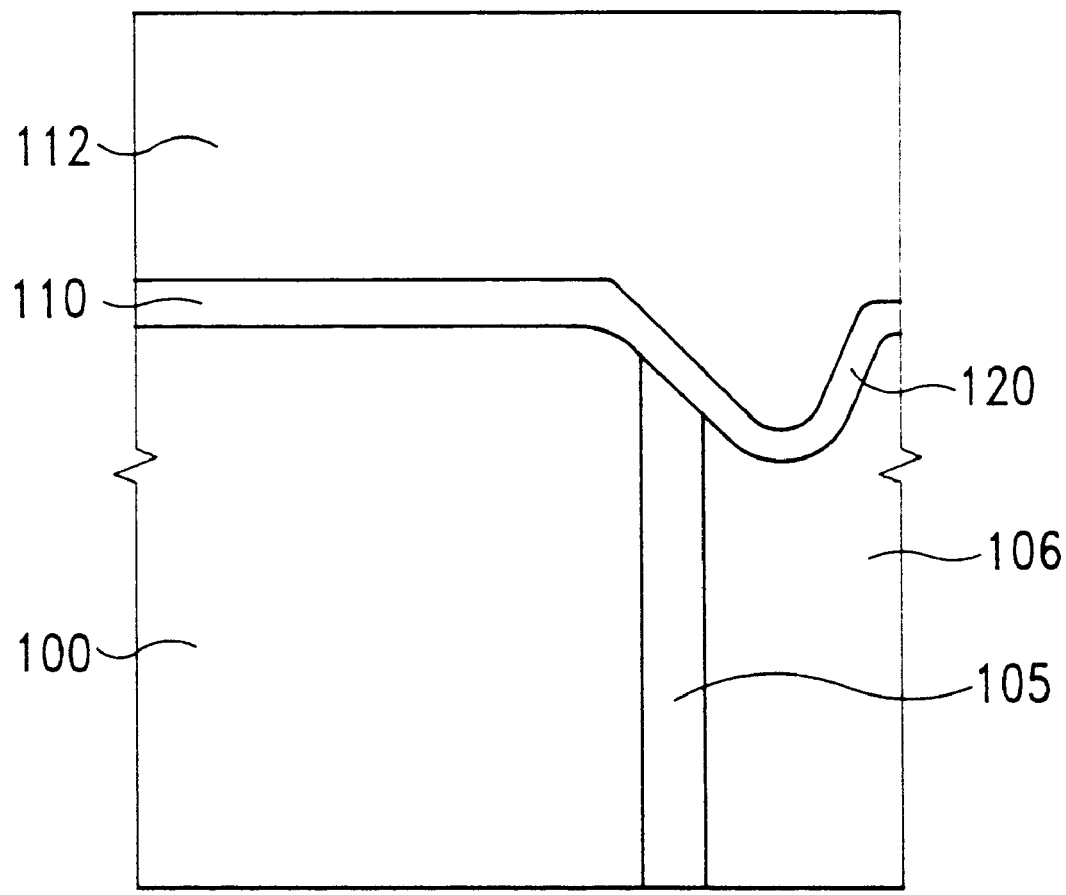
FIG. 9 uses the partial cross sectional view of the shallow trench to illustrate the factor causing the kink effect.
Figure 19:
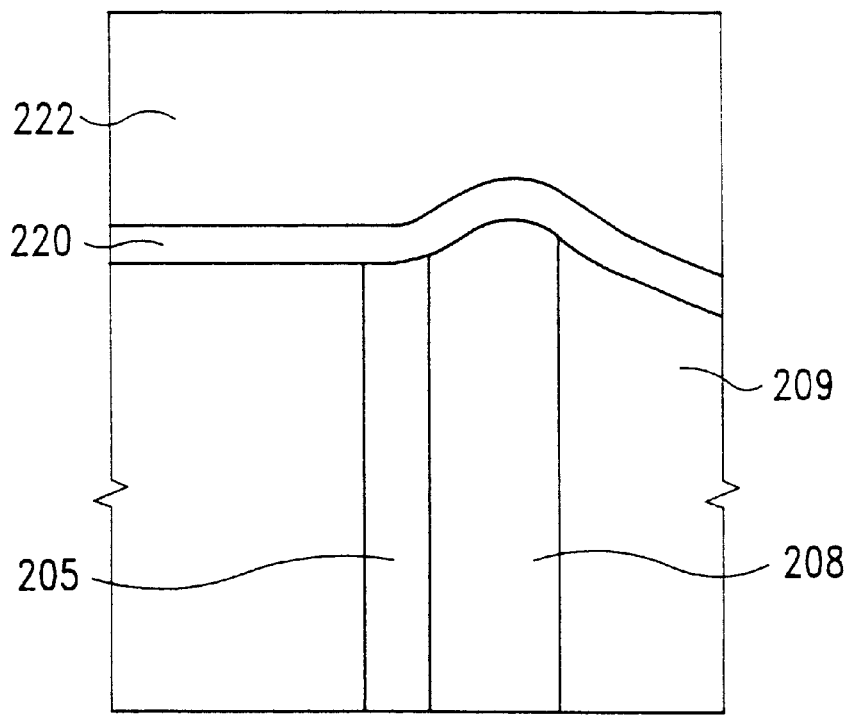

After a series of traditional process fabricating the transistor, the top view of the structure of the transistor mentioned above is identical with FIG. 8. A cross sectional view of the transistor is cut by the broken line aa', and the right portion of the cross sectional view of the transistor near the terminal a' of broken line aa' is shown in FIG. 19. As shown in FIG. 19, even severe recess occur in the trench isolation 209, the transistor is still kink effect free because of the oxynitride liner 208 separating the trench isolation 209 and the thermal oxide liner 205.

As will be understood by persons skilled in the art, the foregoing preferred embodiment of the present invention is illustrative of the present invention rather than limiting the present invention. Having described the invention in connection with a preferred embodiment, for example, if various etchant is used in the preferred embodiment, the modification will now suggest itself to those skilled in the art. While the preferred embodiment of the invention has been illustrated and described, it will be appreciated that various changes can be made therein without departing from the spirit and scope of the invention.

What is claimed is:

1. A method for forming an isolating trench in a substrate, said method comprising:

forming a first dielectric layer and a second dielectric layer on said substrate subsequently;

developing a photoresist pattern on said second dielectric layer;

etching said substrate, said first dielectric layer and said second dielectric layer to form a trench in said substrate;

forming a first silicon dioxide layer in said trench;

removing said photoresist pattern;

forming a third dielectric layer on said second dielectric layer and said first silicon dioxide layer;

filling said trench with silicon dioxide to from an oxide trench;

removing said second dielectric layer, a first portion of said third dielectric layer and a portion of said oxide trench with a chemical mechanical polishing (CMP) and a first solution, said third dielectric layer comprising said first portion of said third dielectric layer and a second portion of said third dielectric layer; and etching said first dielectric layer and said oxide trench by a first diluted HF solution to expose a portion of said substrate, said second portion of said third dielectric layer being used to prevent an oxide loss in said oxide trench, said isolating trench being formed thereof.

2. The method as claim 1, wherein said first dielectric layer is a pad oxide layer.

3. The method as claim 1, wherein said second dielectric layer is a silicon nitride (SiN) layer.

4. The method as claim 1, wherein said third dielectric layer is a silicon oxynitride ($SiO_xN_y$) layer.

5. The method as claim 4, wherein said third dielectric layer is about 50–600 angstroms in thickness.

6. The method as claim 1, wherein said first solution comprising $H_3PO_4$ is used to etch said second dielectric layer.

7. The method as claim 1, wherein said oxide trench is formed by a chemical vapor deposition (CVD).

8. The method as claim 1, wherein said isolating trench in said substrate is formed by said method further comprising:

forming a second silicon dioxide layer on said exposed substrate and said isolating trench;

ion-implanting said substrate to form a channel in said substrate; and removing said second silicon dioxide layer by a second diluted HF solution.

9. The method as claim 1, wherein said first diluted HF solution is a mixture of a hydrofluoric acid and an ammonium fluoride at a ratio about 1:10.

10. A method for forming an isolating trench in a substrate, said method comprising:

forming a pad oxide layer and a silicon nitride layer on said substrate subsequently;

developing a photoresist pattern on said silicon nitride layer;

etching said substrate, said pad oxide layer and said silicon nitride layer to form a trench in said substrate;

forming a first silicon dioxide layer in said trench;

removing said photoresist pattern;

forming a silicon oxynitride layer on said silicon nitride layer and said first silicon dioxide layer by a plasma enhanced chemical vapor deposition (PECVD);

filling said trench with silicon dioxide to from an oxide trench;

removing said silicon nitride layer, a first portion of said silicon oxynitride layer and a portion of said oxide trench with a chemical mechanical polishing (CMP) and a first solution, said silicon oxynitride layer comprising said first portion of said silicon oxynitride layer and a second portion of said silicon oxynitride layer; and etching said pad oxide layer and said oxide trench by a first diluted HF solution to expose a portion of said substrate, said second portion of said silicon oxynitride layer being used to prevent an oxide loss in said oxide trench, said isolating trench being formed thereof.

11. The method as claim 10, wherein said silicon oxynitride layer is composed of $SiO_xN_y$, that x and y are in the range about $0.8 \leq x \leq 1.2$ and $0.15 \leq y \leq 0.4$ respectively.

12. The method as claim 11, wherein said silicon oxynitride layer is formed using a $N_2O$ flow small than a flow rate of 2000 cubic centimeter per minute.

13. The method as claim 11, wherein said silicon oxynitride layer is formed by said PECVD using a source power about 350 Watts at a switching frequency of about 13.56 MHz.

14. The method as claim 11, wherein said silicon oxynitride layer is formed by said PECVD using said source power about 0–200 Watts at said switching frequency of about 200–400 KHz.

15. The method as claim 10, wherein said silicon oxynitride layer is about 50–600 angstroms in thickness.

16. The method as claim 10, wherein said first solution comprising $H_3PO_4$ is used to etch said silicon nitride layer.

17. The method as claim 10, wherein said oxide trench is formed by a chemical vapor deposition (CVD).

18. The method as claim 10, wherein said isolating trench in said substrate is formed by said method further comprising:

forming a second silicon dioxide layer on said exposed substrate and said isolating trench;
  ion-implanting said substrate to form a channel in said substrate; and
  removing said second silicon dioxide layer by a second diluted HF solution.

19. The method as claim 10, wherein said first diluted HF solution is a mixture of a hydrofluoric acid and an ammonium fluoride at a ratio about 1:10.

* * * * *